(12) United States Patent
Hams et al.

(10) Patent No.: US 10,031,654 B2
(45) Date of Patent: Jul. 24, 2018

(54) APPARATUS AND METHOD FOR GENERATING INDUSTRIAL PROCESS GRAPHICS

(71) Applicant: Honeywell International Inc., Morris Plains, NJ (US)

(72) Inventors: Colin Hams, Mango Hill (AU); David Barry Granatelli, Lilyfield (AU); Thomas Street, Meadowbank (AU); Graeme Laycock, Hunters Hill (AU); David James Cupitt, Seaforth (AU); Matthew Willmott, Katy, TX (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/273,254

(22) Filed: Sep. 22, 2016

(65) Prior Publication Data
US 2017/0293418 A1 Oct. 12, 2017

Related U.S. Application Data

(60) Provisional application No. 62/321,573, filed on Apr. 12, 2016.

(51) Int. Cl.
| | |
|---|---|
| *G06F 3/00* | (2006.01) |
| *G06F 3/0484* | (2013.01) |
| *G06F 17/50* | (2006.01) |
| *G06T 11/60* | (2006.01) |
| *G06F 17/27* | (2006.01) |

(52) U.S. Cl.
CPC ........ *G06F 3/04845* (2013.01); *G06F 17/509* (2013.01); *G06T 11/60* (2013.01); *G06F 3/04842* (2013.01); *G06F 17/2705* (2013.01); *G06T 2207/30108* (2013.01)

(58) Field of Classification Search
CPC .................................. G06F 3/0481–3/0489
See application file for complete search history.

(56) References Cited

U.S. PATENT DOCUMENTS

| | | | | |
|---|---|---|---|---|
| 5,481,741 A | * | 1/1996 | McKaskle | G06F 3/0481 345/522 |
| 5,610,828 A | * | 3/1997 | Kodosky | G01R 31/31912 345/418 |
| 5,828,851 A | * | 10/1998 | Nixon | G05B 19/0421 710/105 |

(Continued)

FOREIGN PATENT DOCUMENTS

KR 10-2013-0120298 A 11/2013

OTHER PUBLICATIONS

International Search Report and Written Opinion of the International Searching Authority dated Jun. 13, 2017 in connection with International Patent Application No. PCT/US2017/022415, 12 pages.

*Primary Examiner* — Steven B Theriault

(57) ABSTRACT

A method includes parsing information associated with an industrial process in an industrial process control system to identify equipment data associated with the industrial process. The method also includes receiving a selection of equipment. The method further includes identifying one or more shapes associated with the selected equipment. In addition, the method includes automatically generating at least one process graphic containing the one or more shapes and the equipment data.

20 Claims, 11 Drawing Sheets

(56) References Cited

U.S. PATENT DOCUMENTS

| | | | | |
|---|---|---|---|---|
| 5,838,563 A * | 11/1998 | Dove | G05B 19/0426 | 700/18 |
| 5,847,953 A * | 12/1998 | Sojoodi | G05B 19/0426 | 700/83 |
| 5,910,803 A * | 6/1999 | Grau | H04L 41/12 | 709/224 |
| 5,926,463 A * | 7/1999 | Ahearn | H04L 41/024 | 370/254 |
| 6,098,028 A * | 8/2000 | Zwan | H04L 12/2697 | 702/108 |
| 6,173,438 B1 * | 1/2001 | Kodosky | G06F 8/34 | 717/105 |
| 6,219,628 B1 * | 4/2001 | Kodosky | G06F 8/34 | 702/57 |
| 6,437,805 B1 * | 8/2002 | Sojoodi | G05B 19/0426 | 715/763 |
| 6,584,601 B1 * | 6/2003 | Kodosky | G06F 17/5054 | 715/771 |
| 6,608,638 B1 * | 8/2003 | Kodosky | G06F 11/2294 | 703/22 |
| 6,784,902 B1 * | 8/2004 | Melder | G06F 8/34 | 715/771 |
| 6,784,903 B2 * | 8/2004 | Kodosky | G06F 8/34 | 714/E11.171 |
| 6,802,053 B1 * | 10/2004 | Dye | G06F 8/34 | 715/740 |
| 6,876,368 B2 * | 4/2005 | Dove | G06F 8/34 | 715/762 |
| 6,889,172 B2 * | 5/2005 | Sierer | G06Q 20/10 | 702/119 |
| 6,934,667 B2 * | 8/2005 | Kodosky | G06F 8/34 | 702/57 |
| 7,013,232 B2 * | 3/2006 | Fuller, III | G06F 9/44505 | 702/119 |
| 7,062,718 B2 * | 6/2006 | Kodosky | G05B 19/0426 | 703/21 |
| 7,076,411 B2 * | 7/2006 | Santori | G06F 9/4443 | 703/6 |
| 7,076,740 B2 * | 7/2006 | Santori | G06F 8/34 | 703/4 |
| 7,095,321 B2 * | 8/2006 | Primm | G08B 13/19656 | 340/3.1 |
| 7,120,874 B2 * | 10/2006 | Shah | G06F 8/34 | 709/223 |
| 7,139,979 B2 * | 11/2006 | Schultz | G09G 5/00 | 715/763 |
| 7,162,387 B2 * | 1/2007 | Johnson | H04L 43/50 | 702/119 |
| 7,200,838 B2 * | 4/2007 | Kodosky | G06F 8/34 | 715/762 |
| 7,356,774 B2 * | 4/2008 | Shah | G01R 19/2516 | 715/744 |
| 7,468,731 B2 * | 12/2008 | Eldridge | G06F 3/0486 | 345/156 |
| 7,555,706 B2 | 6/2009 | Chapman et al. | | |
| 7,882,445 B2 * | 2/2011 | Neumann | G06F 8/34 | 715/762 |
| 8,028,242 B2 * | 9/2011 | Kodosky | G06F 8/34 | 715/762 |
| 2003/0101023 A1 * | 5/2003 | Shah | G06F 9/44505 | 702/186 |
| 2004/0153804 A1 * | 8/2004 | Blevins | G05B 15/02 | 714/33 |
| 2007/0132779 A1 * | 6/2007 | Gilbert | G05B 19/0426 | 345/619 |
| 2007/0240067 A1 * | 10/2007 | Eldridge | G06Q 10/06 | 715/762 |
| 2008/0140230 A1 | 6/2008 | Bromley | | |
| 2009/0157200 A1 * | 6/2009 | Hams | G05B 23/0267 | 700/83 |
| 2010/0082131 A1 | 4/2010 | Baier et al. | | |
| 2011/0087977 A1 * | 4/2011 | Campney | G05B 19/0426 | 715/763 |
| 2011/0087988 A1 * | 4/2011 | Ray | G06Q 10/06 | 715/771 |
| 2014/0108985 A1 * | 4/2014 | Scott | G06F 3/0484 | 715/771 |
| 2014/0223342 A1 | 8/2014 | Hood et al. | | |
| 2014/0277619 A1 * | 9/2014 | Nixon | G05B 15/02 | 700/83 |
| 2014/0380177 A1 | 12/2014 | Gutermuth et al. | | |

* cited by examiner

APPARATUS AND METHOD FOR GENERATING INDUSTRIAL PROCESS GRAPHICS

CROSS-REFERENCE TO RELATED APPLICATION AND PRIORITY CLAIM

This application claims priority under 35 U.S.C. § 119(e) to U.S. Provisional Patent Application No. 62/321,573 filed on Apr. 12, 2016, which is hereby incorporated by reference in its entirety.

COPYRIGHT NOTICE

A portion of the disclosure of this patent document contains material that is subject to copyright protection. The copyright owner has no objection to the facsimile reproduction by anyone of the patent disclosure, as it appears in the U.S. Patent and Trademark Office patent files or records, but otherwise reserves all copyright rights whatsoever.

TECHNICAL FIELD

This disclosure relates generally to industrial process control and automation systems. More specifically, this disclosure relates to an apparatus and method for generating industrial process graphics.

BACKGROUND

Industrial process control and automation systems are often used to automate large and complex industrial processes. These types of systems routinely include sensors, actuators, and controllers. Some of the controllers receive measurements from the sensors and generate control signals for the actuators.

Human-machine interfaces (HMIs) are often used in process control and automation systems to provide information graphically to operators or other users. HMI applications targeted to industrial process control and automation markets typically need to provide continuous views to industrial processes being monitored or controlled. This is often accomplished using a number of process graphics that represent an entire industrial process via a number of smaller functional processes. Each process graphic may contain numerical and graphical elements that represent the corresponding functional process to be monitored or controlled.

Large industrial processes may require numerous process graphics for a single HMI application. These process graphics are typically created manually, such as by using process graphic building applications based on piping and instrumentation diagrams (P&IDs), engineering procurement and construction (EPC) documents, or models or ontologies that represent an industrial process. Creating these process graphics manually is very labor-intensive and allows inconsistencies to occur in HMI styles across process graphics. Also as graphical rendering technology evolves, there is a need to migrate existing process graphics that represent industrial processes to the new rendering technology. These pre-existing graphics may have been created tens of years ago and may not follow current best practice guidelines. Consequently many displays are completely redesigned. Creating the new rendering technology version of the process graphics manually is very labor-intensive.

SUMMARY

This disclosure provides an apparatus and method for generating industrial process graphics.

In a first embodiment, a method includes parsing information associated with an industrial process in an industrial process control system to identify equipment data associated with the industrial process. The method also includes receiving a selection of equipment. The method further includes identifying one or more shapes associated with the selected equipment. In addition, the method includes automatically generating at least one process graphic containing the one or more shapes and the equipment data.

In a second embodiment, an apparatus includes at least one memory and at least one processing device. The at least one memory is configured to store information associated with an industrial process in an industrial process control system. The at least one processing device is configured to parse the information to identify equipment data associated with the industrial process. The at least one processing device is also configured receive a selection of equipment. The at least one processing device is further configured to identify one or more shapes associated with the selected equipment. In addition, the at least one processing device is configured to automatically generate at least one process graphic containing the one or more shapes and the equipment data.

In a third embodiment, a non-transitory computer readable medium contains instructions that, when executed by at least one processing device, cause the at least one processing device to parse information associated with an industrial process in an industrial process control system to identify equipment data associated with the industrial process. The medium also contains instructions that cause the at least one processing device to receive a selection of equipment. The medium further contains instructions that cause the at least one processing device to identify one or more shapes associated with the selected equipment. In addition, the medium contains instructions that cause the at least one processing device to automatically generate at least one process graphic containing the one or more shapes and the equipment data.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 12, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
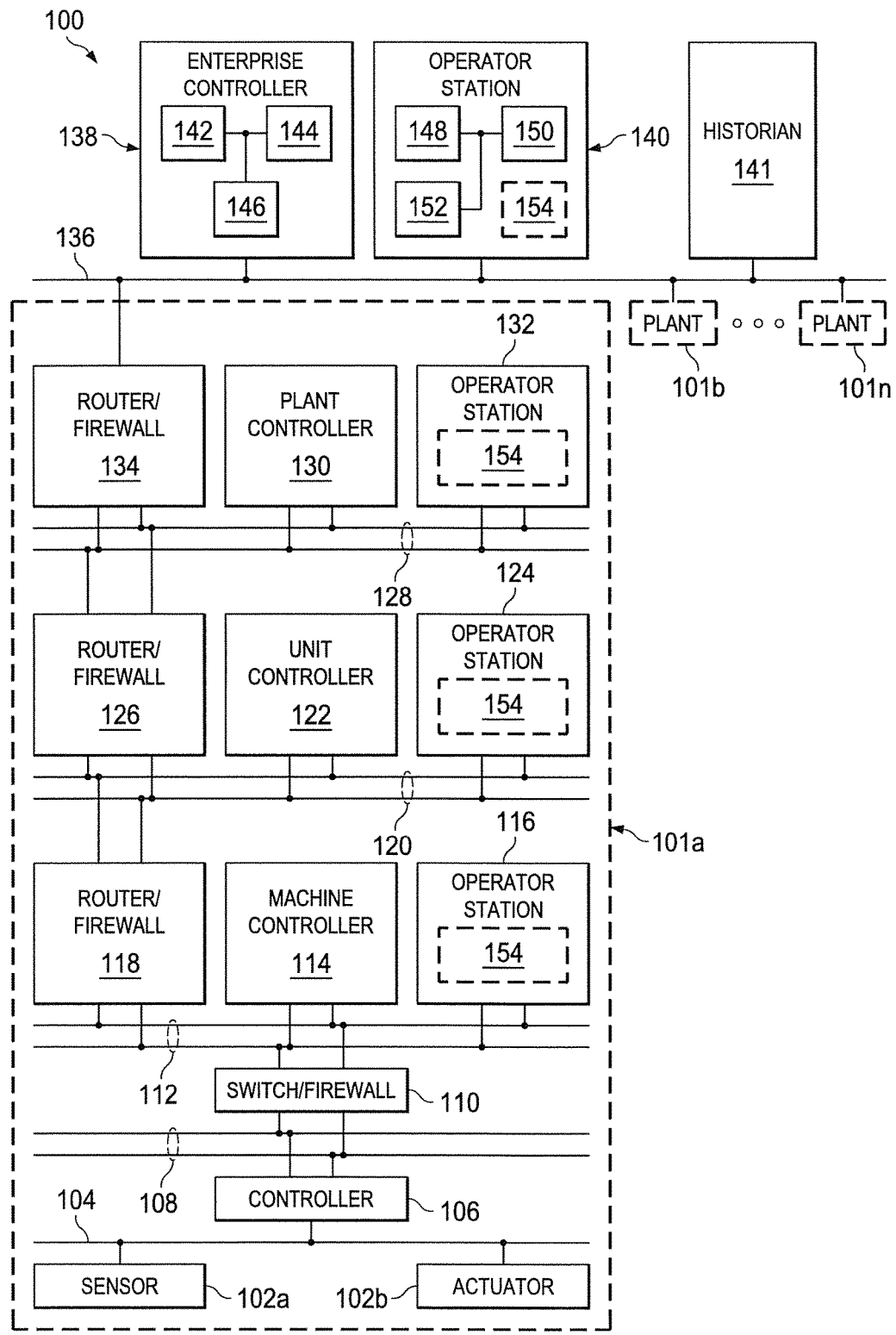
FIG. 1 illustrates an example industrial process control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Multiple controllers 106 could also operate in a redundant configuration, such as when one controller 106 operates as a primary controller while another controller 106 operates as a backup controller (which synchronizes with the primary controller and can take over for the primary controller in the event of a fault with the primary controller). Each controller 106 includes any suitable structure for interacting with one or more sensors 102a and controlling one or more actuators 102b. Each controller 106 could, for example, represent a proportional-integral-derivative (PID) controller or a multi-variable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

One or more networks 108 are coupled to the controllers 106. The networks 108 facilitate interaction with the controllers 106, such as by transporting data to and from the controllers 106. The networks 108 could represent any suitable networks or combination of networks. As a particular example, the networks 108 could represent an Ethernet network or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as an FTE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102a, and actuators 102b).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as an FTE network.

In the Purdue model, "Level 4" may include one or more plant-level controllers 130 coupled to the networks 128. Each plant-level controller 130 is typically associated with one of the plants 101a-101n, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101a-101n and to control various aspects of the plants 101a-101n. The enterprise-level controllers 138 can also perform various functions to support the operation and control of components in the plants 101a-101n. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101a is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers 106, 114, 122, 130, 138 could include one or more processing devices 142 and one or more memories 144 for storing instructions and data used, generated, or collected by the processing device(s) 142. Each of the controllers 106, 114, 122, 130, 138 could also include at least one network interface 146, such as one or more Ethernet interfaces or wireless transceivers. Also, each of the operator stations 116, 124, 132, 140 could include one or more processing devices 148 and one or more memories 150 for storing instructions and data used, generated, or collected by the processing device(s) 148. Each of the operator stations 116, 124, 132, 140 could also include at least one network interface 152, such as one or more Ethernet interfaces or wireless transceivers.

As noted above, human-machine interfaces (HMIs) are often used in process control and automation systems to graphically provide information to operators or other users, and HMI applications targeted to industrial process control and automation markets often use a number of process graphics. These process graphics could be presented to operators or other users via the various operator stations 116, 124, 132, or 140 or other devices in the system 100. Manually creating process graphics for an HMI application is very labor-intensive and allows inconsistencies to occur in HMI styles across process graphics.

In accordance with this disclosure, one or more process graphic builder tools 154 are provided in the system 100. Each process graphic builder tool 154 supports a technique for automatically generating process graphics, such as from one or more existing models or ontologies of one or more industrial processes. For example, the process graphic builder tool 154 can receive, from a user, a selection of equipment to be included in a process graphic. The process graphic builder tool 154 can also automatically generate multiple representations of a process graphic with the selected equipment, such as multiple representations based on different potential process conditions and different process workflows. Further, the process graphic builder tool 154 can automatically generate graphics with different levels of abstraction. One of the benefits of P&ID-style graphics is that they are easily understood due to being literal representations of the layout of a plant. However, a higher level of abstraction may be required for specific applications, and the tool 154 allows different levels of abstraction to be generated without having to manually create each visual representation. In addition, the process graphic builder tool 154 can generate process graphics that automatically respond to a current display form factor. Consequently, the same display can be used across different types of devices, such as operator stations, mobile phones, and tablet computers.

Additional details regarding the process graphic builder tool 154 are provided below. The process graphic builder tool 154 denotes any suitable component configured to support the automatic generation of process graphics. The process graphic builder tool 154 could, for example, be implemented using hardware or a combination of hardware and software/firmware. As a particular example, the process graphic builder tool 154 could denote a software application executed by one or more computing devices. Note that while the process graphic builder tool 154 is shown in FIG. 1 as residing on or being executed by various operator stations, the process graphic builder tool 154 could be executed on or provided by any other suitable device(s).

Although FIG. 1 illustrates one example of an industrial process control and automation system 100, various changes may be made to FIG. 1. For example, a control and automation system could include any number of sensors, actuators, controllers, operator stations, networks, process graphic builder tools, and other components. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, control and automation systems are highly configurable and can be configured in any suitable manner according to particular needs. In addition, FIG. 1 illustrates an example environment in which the generation of process graphics can be used. This functionality can be used in any other suitable system.

Figure 2:
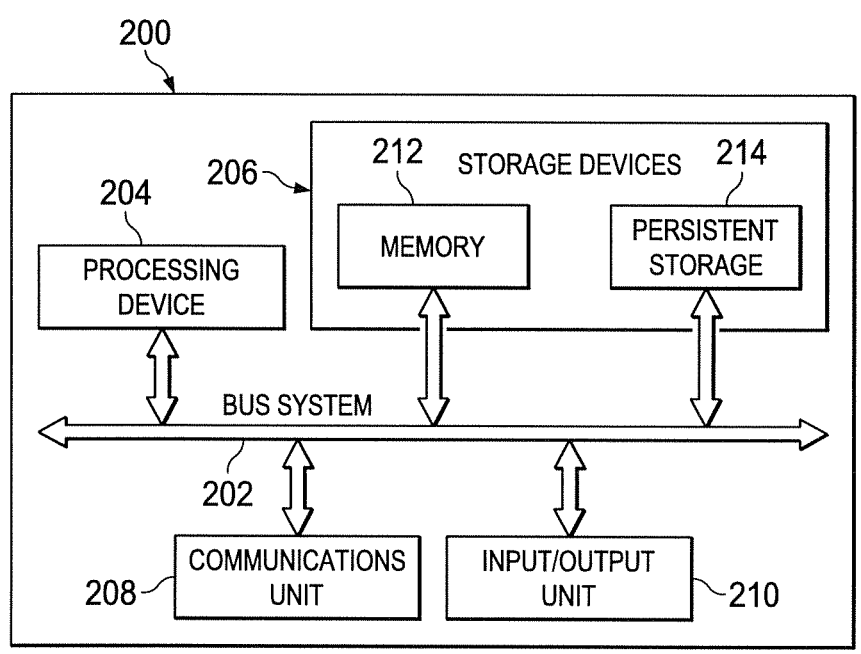
FIG. 2 illustrates an example computing device for generating industrial process graphics according to this disclosure.

FIG. 2 illustrates an example computing device 200 for generating industrial process graphics according to this disclosure. The device 200 could, for example, denote any of the operator stations or other devices executing the process graphic builder tool 154 in the system 100 of FIG. 1. However, the device 200 could be used in any other suitable system.

As shown in FIG. 2, the device 200 includes a bus system 202, which supports communication between at least one processing device 204, at least one storage device 206, at least one communications unit 208, and at least one input/output (I/O) unit 210. The processing device 204 executes instructions that may be loaded into a memory 212. The processing device 204 may include any suitable number(s) and type(s) of processors or other devices in any suitable arrangement. Example types of processing devices 204 include microprocessors, microcontrollers, digital signal processors, field programmable gate arrays, application specific integrated circuits, and discrete circuitry.

The memory 212 and a persistent storage 214 are examples of storage devices 206, which represent any structure(s) capable of storing and facilitating retrieval of information (such as data, program code, and/or other suitable information on a temporary or permanent basis). The memory 212 may represent a random access memory or any other suitable volatile or non-volatile storage device(s). The persistent storage 214 may contain one or more components or devices supporting longer-term storage of data, such as a read only memory, hard drive, Flash memory, or optical disc.

The communications unit 208 supports communications with other systems or devices. For example, the communications unit 208 could include a network interface card or a wireless transceiver facilitating communications over at least one network. The communications unit 208 may support communications through any suitable physical or wireless communication link(s).

The I/O unit 210 allows for input and output of data. For example, the I/O unit 210 may provide a connection for user input through a keyboard, mouse, keypad, touchscreen, or other suitable input device. The I/O unit 210 may also send output to a display, printer, or other suitable output device.

Although FIG. 2 illustrates one example of a computing device 200 for generating industrial process graphics, various changes may be made to FIG. 2. For example, computing devices come in a wide variety of configurations. The device 200 shown in FIG. 2 is meant to illustrate one example type of computing device and does not limit this disclosure to a particular type of computing device.

Figure 3:
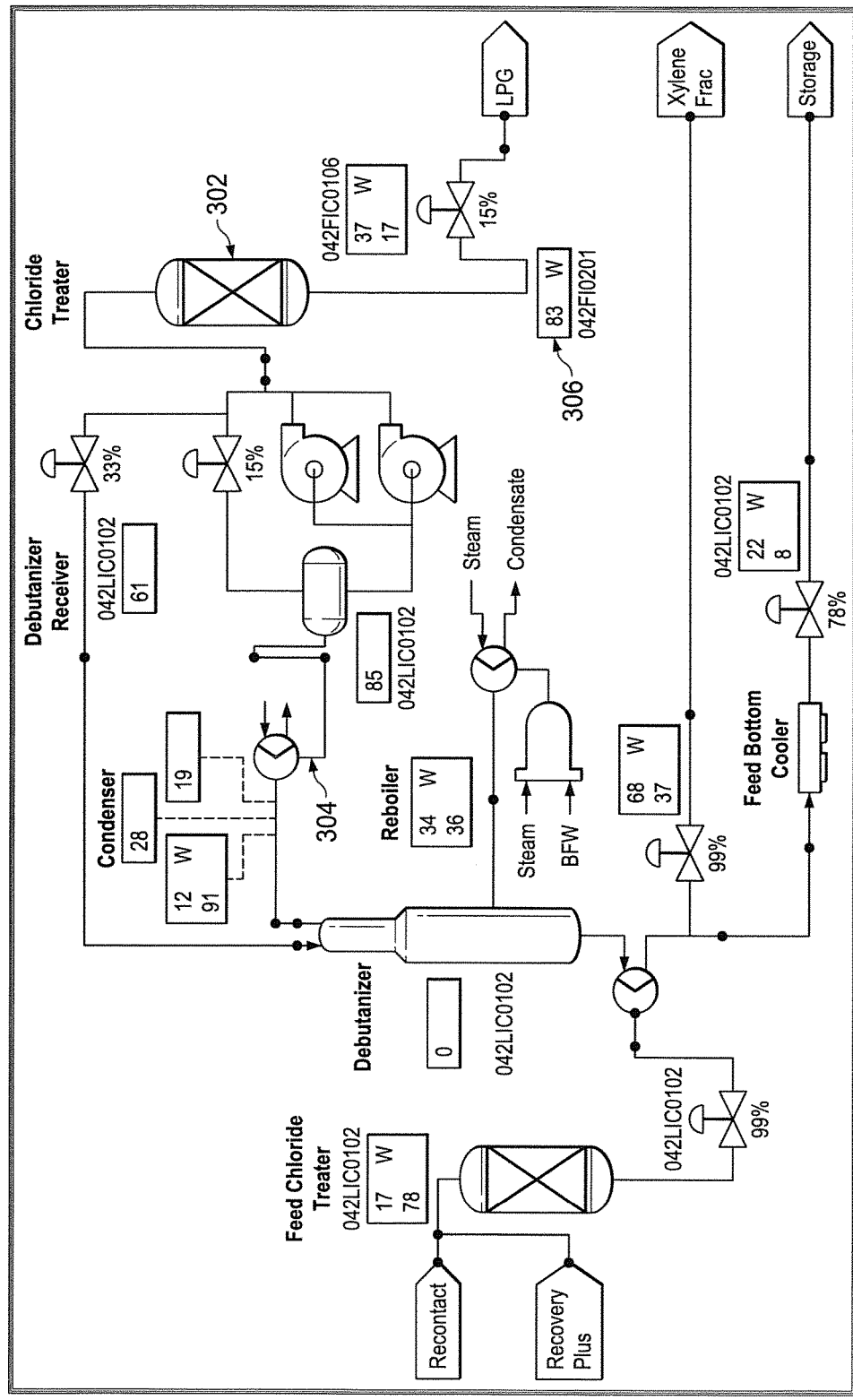
FIGS. 3 through 5 illustrate example process graphics for an industrial process control and automation system according to this disclosure.
Figure 4:
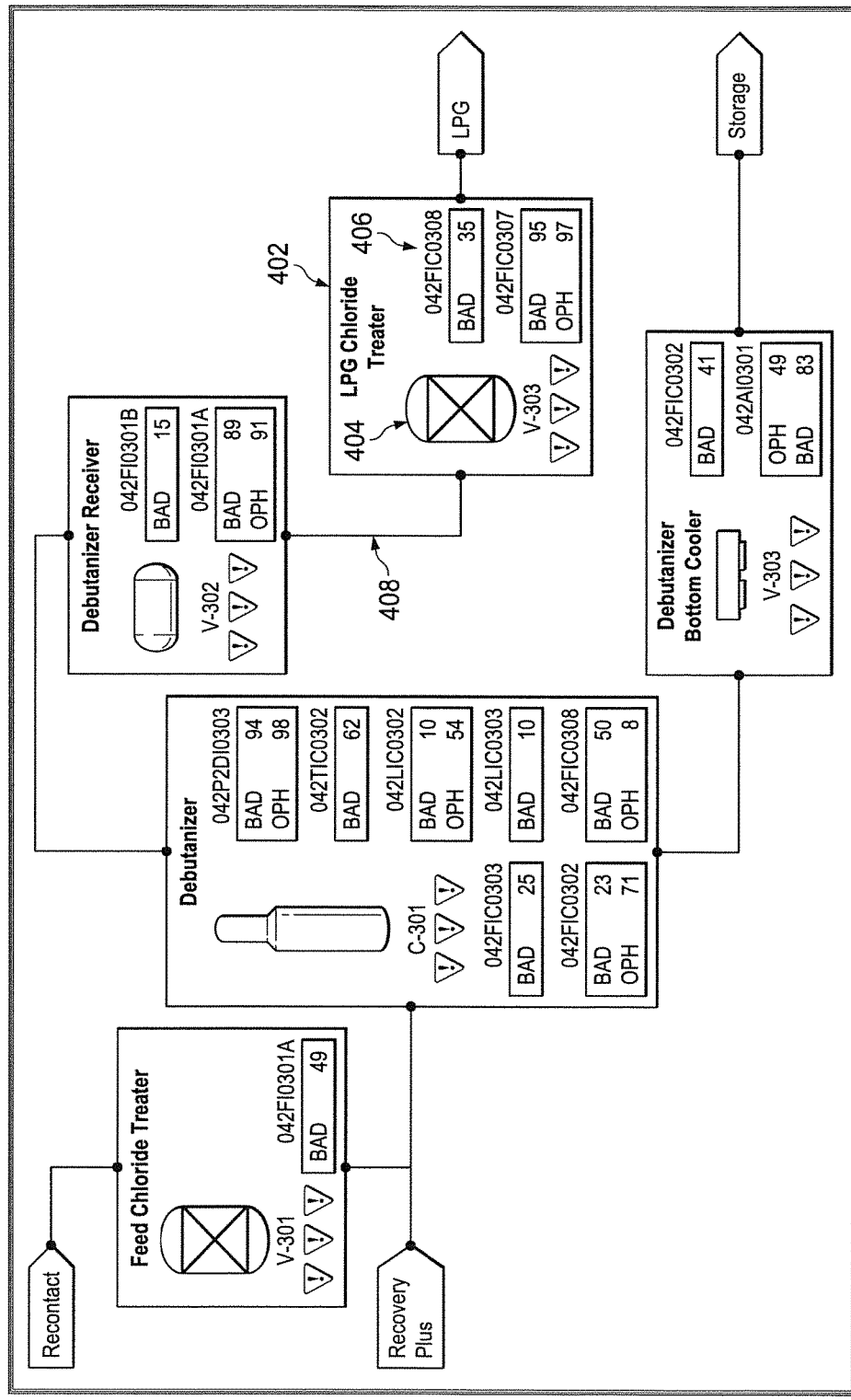
Figure 5:
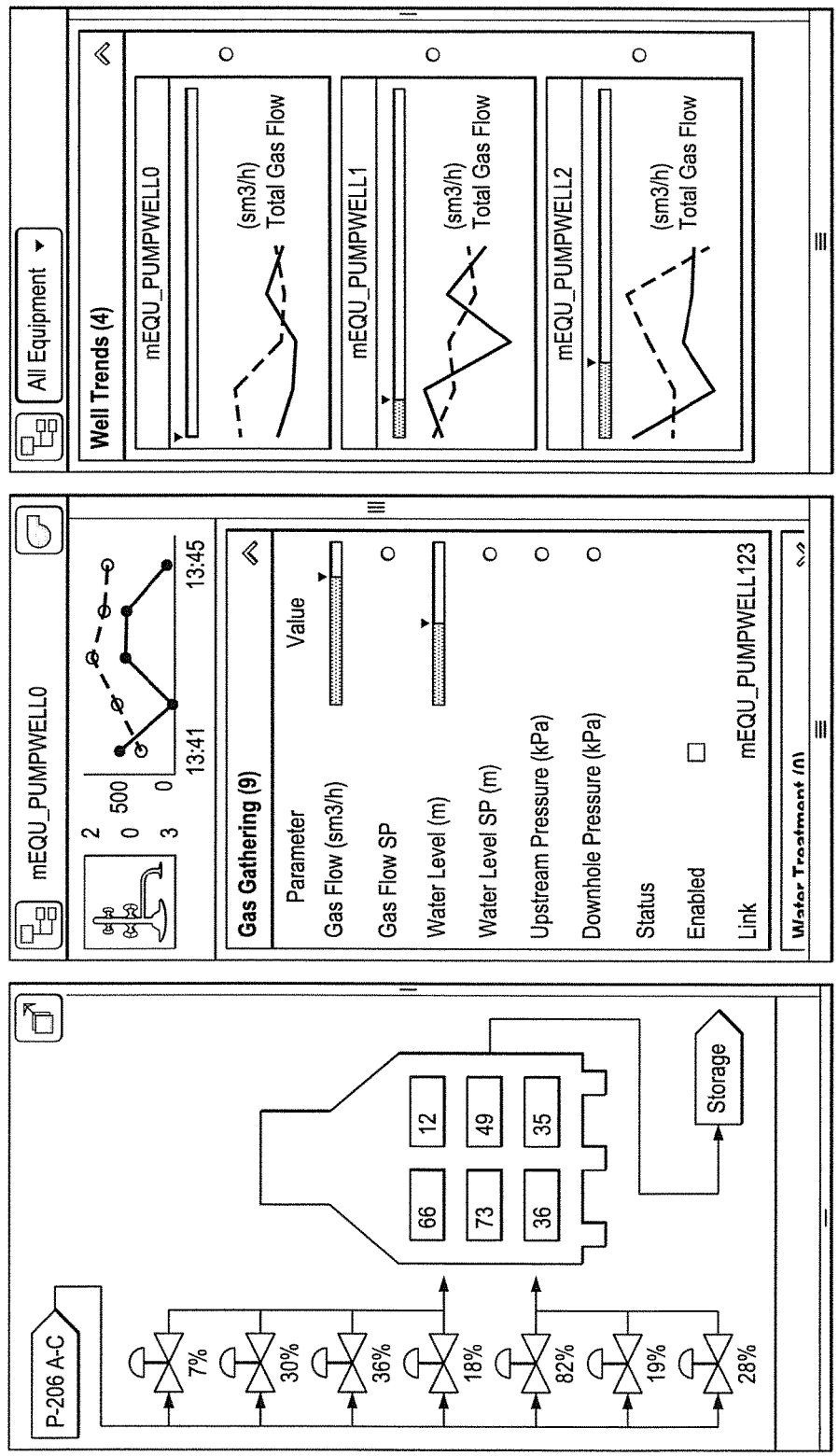

FIGS. 3 through 5 illustrate example process graphics for an industrial process control and automation system according to this disclosure. In particular, FIG. 3 illustrates an example P&ID process graphic 300 defining at least one industrial process or portion(s) thereof. FIG. 4 illustrates a process graphic 400 that represents the process graphic 300 but at a higher level of abstraction. FIG. 5 illustrates process graphics 500 that could be presented on a smaller display screen, such as on a mobile phone or tablet computer.

In FIG. 3, the P&ID process graphic 300 is a detailed schematic of at least one industrial process or portion(s) thereof. The graphic 300 includes a number of graphical elements 302 representing components in the industrial process. In the graphic 300, both major and minor components of the industrial process are shown. Many of the graphical elements 302 have a shape that resembles the actual represented industrial component or a shape that is commonly used and understood in the art of industrial schematics to represent a particular industrial component. The graphic 300 also includes a number of connection lines 304 between various ones of the graphical elements 302. Each connection line 304 represents a connection between the corresponding industrial components. The graphic 300 is detailed, so all connection lines 304 are shown and arranged in a manner consistent with a schematic representation of an industrial process. In addition, the graphic 300 includes a number of values 306, where each value 306 is related to a graphical element 302 and represents a value or parameter (e.g., temperature, pressure, volume, etc.) associated with the corresponding industrial component.

In contrast to the detailed P&ID view of FIG. 3, FIG. 4 shows the process graphic 400 as a more abstract representation of at least one industrial process or portion(s) thereof. This representation can be better suited for a monitoring and control view of the industrial process. In the process graphic 400, key information for each asset or component is grouped together and outlined with a box 402 to indicate the relationship between the asset and the information. Each box 402 surrounds a graphical element 404 and one or more values 406. Each graphical element 404 represents a component in the industrial process. Unlike the graphical elements 302 of FIG. 3, which often resemble a particular industrial component, the graphical elements 404 can be generic. The values 406 may be displayed in a more tabular or columnar arrangement, compared to the schematic arrangement of values 306 in FIG. 3. The arranged display of the values 406 can promote rapid review and interpretation of the values 406 by a user. The process graphic 400 also includes connection lines 408. Compared to the process graphic 300 of FIG. 3, the process graphic 400 does not show every connection, but key connections are displayed.

In some embodiments, both the process graphic 300 of FIG. 3 and the process graphic 400 of FIG. 4 can be used for control of the same industrial process. In some embodiments, process graphics similar to the process graphic 300 can be used for industrial components at certain Purdue levels (e.g., level 2 or level 3), and other process graphics similar to the process graphic 400 can be used for components at higher or lower levels (e.g., level 1 or level 4).

The process graphics 300, 400 are configured for a comparatively larger display screen, such as a desktop display at an operator station (e.g., the operator stations 116, 124, 132, 140). As shown in FIG. 5, the process graphics 500 are configured for presentation on a smaller display screen, such as on a mobile phone or tablet computer. While the process graphics 500 generally include graphical components, connection lines, and values similar to those of the process graphics 300, 400, the process graphics 500 are for a smaller form factor and therefore may include less information than the process graphics 300, 400. For example, in some embodiments, each process graphic 500 shows information associated with only one or two industrial components.

Using the techniques described below, the process graphic builder tool 154 can be used to generate any of these types of process graphics 300, 400, 500, as well as any other or additional types of process graphics. Moreover, the process graphic builder tool 154 can accomplish this with a reduced or minimal amount of user input. For example, in some embodiments, a user merely needs to identify the equipment to be included in process graphics. In other embodiments, the user could identify a target platform for the process graphics (operator station, mobile phone, tablet computer, etc.), and the process graphic builder tool 154 could generate process graphics for that specific platform. Also, the user could identify one or more models, ontologies, or other information associated with at least one industrial process. The user could further provide any other suitable information for use in generating the process graphics. Regardless, the process graphic builder tool 154 could generate the process graphics with much less user input.

Although FIGS. 3 through 5 illustrate examples of process graphics for an industrial process control and automation system, various changes may be made to FIGS. 3 through 5. For example, these figures are merely meant to illustrate example types of process graphics that could be generated by the process graphic builder tool 154. The process graphic builder tool 154 could be used to generate any other or additional types of process graphics.

FIGS. 6 through 12 illustrate an example technique 600 for generating industrial process graphics and related details according to this disclosure. For ease of explanation, FIGS. 6 through 12 are described as being performed by the process graphic builder tool 154 operating on a computing device 200 as shown in FIG. 2 in the system 100 of FIG. 1. However, this technique could be used with any other suitable device or in any other suitable system.

Figure 6:
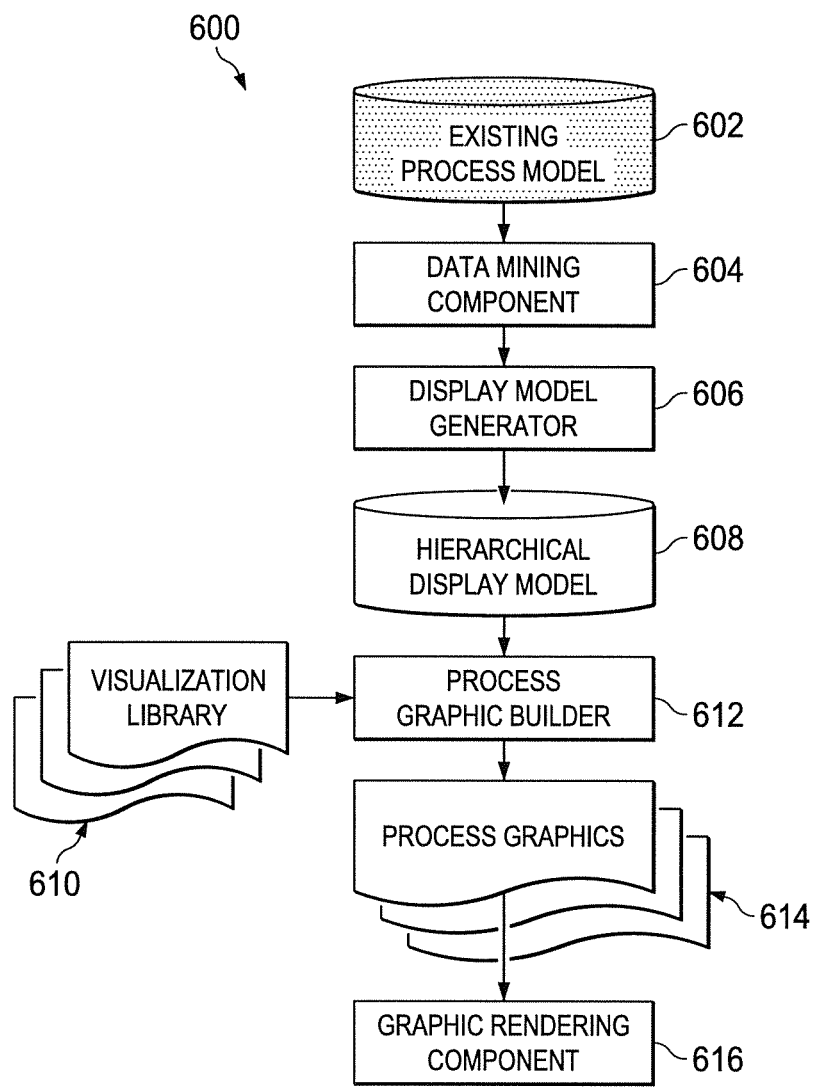
FIGS. 6 through 12 illustrate an example technique for generating industrial process graphics and related details according to this disclosure.

As shown in FIG. 6, the process graphic builder tool 154 receives at least one existing process model 602 from a source, such as one or more databases or any other suitable source of process-related information. The process model 602 could denote a data model, ontology, or other process-related information associated with an industrial process. In some embodiments, the process model 602 could include an equipment model, a blending and movement model, a P&ID diagram, pre-existing process graphic, or similar.

The process model 602 is provided to a data mining component 604, which parses the information in the process model 602 to extract or identify certain data. The data mining component 604 could support a standard or proprietary interface for interacting with at least one data source, such as an ISO15926 interface. The extracted data is used by the process graphic builder tool 154 to allow selection of equipment and generation of process graphics. Example types of data extracted from the process model 602 by the data mining component 604 could include, for each piece of equipment:

Equipment Item Name: Identifier of a piece of equipment.
Class: Class of the piece of equipment (such as a valve). The Class may further include a Type, which represents the specific type of equipment (such as vertical or horizontal).
Equipment Relationships: A list of relationships to other pieces of equipment. The 'Equipment Relationships' data may further include a 'Related Equipment Identifier', which identifies each related piece of equipment; and a 'Role', which represents the type of relationship (such as incoming, outgoing, upstream, or downstream) to each related piece of equipment.
Equipment Point Name: Name of the corresponding process control tag.
Asset identifier: Identifier for a logical group to which the equipment belongs (such as a Debutanizer unit).

Any other or additional information could be obtained by the data mining component 604.

Extracted information obtained by the data mining component 604 is provided to a display model generator 606. The display model generator 606 uses this data to construct at least one hierarchical display model 608. Each hierarchical display model 608 generally provides a hierarchical metadata model of the equipment in at least one industrial process for which process graphics could be generated.

Figure 7:
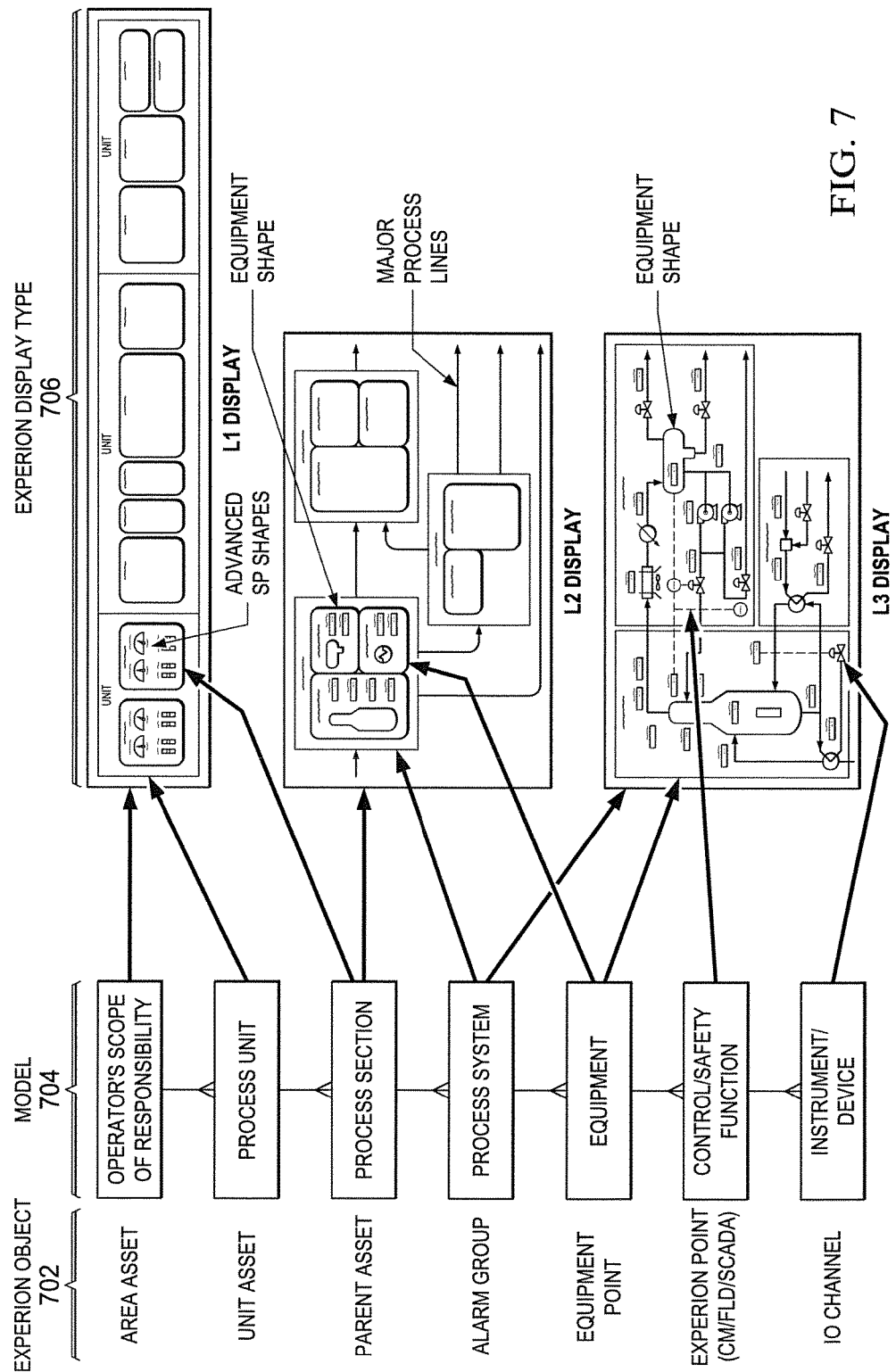

FIG. 7 illustrates an example of a hierarchical display model 608 according to this disclosure. The hierarchical display model 608 shown in FIG. 7 is based on a HONEY-WELL EXPERION control system. The model 608 includes a sample hierarchy of EXPERION objects 702, model objects 704, and display objects 706. Arrows and connectors between the objects 702-706 establish relationships, process flow information, and visual definitions.

The hierarchical display model 608 and at least one visualization library 610 are provided to a process graphic builder 612. In some embodiments, the visualization library 610 contains visual representations of equipment-level shapes to be used in generating process graphics, and each equipment-level shape groups together multiple instrument-level (sometimes referred to as device-level) shapes (such as valve, pump, or controller shapes) and data binding references for functional equipment blocks into a single visual representation object block (such as a debutanizer). The visualization library 610 can be configured for any suitable graphical or visual rendering technology or protocol, including HTML5, MICROSOFT ACTIVEX, or a HONEYWELL proprietary graphical protocol. As graphical rendering technology changes over time, the format or protocol associated with each visualization library can also change. The visualization library(s) 610 could be obtained from any suitable source(s), such as one or more databases.

Figure 8:
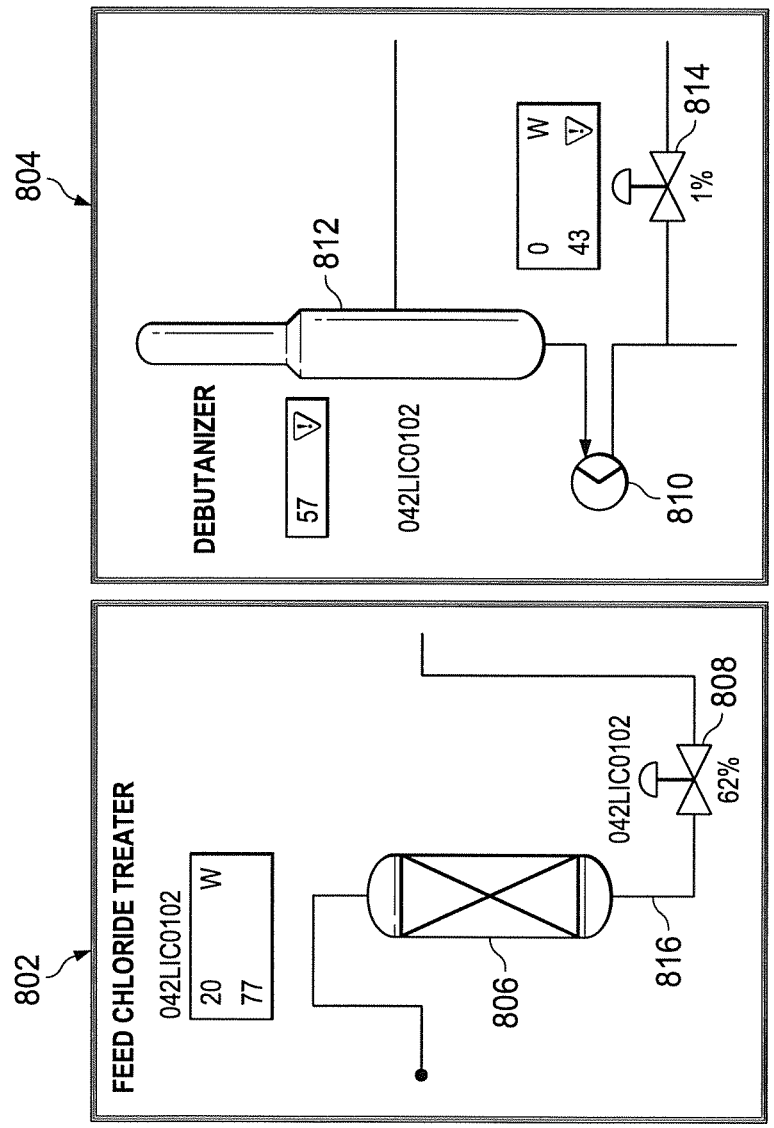

FIG. 8 illustrates examples of equipment-level shapes 802-804 that may be included in the visualization library 610. As shown in FIG. 8, each of the equipment-level shapes 802-804 can include multiple instrument-level shapes 806-814 connected by dynamic connectors 816. The dynamic connectors 816 can be associated with various relationships, process flows, triggers, actions, and behaviors. Each equipment-level shape 802-804 comprising multiple instrument-level shapes 806-814 can be handled by the user as a single functional equipment block that groups the instrument-level information and flows together. This allows the user to avoid having to manually position the instrument-level shapes 806-814 adjacent to each other and individually draw each connector 816. Instead, the user can select and drag an equipment-level shape 802-804, and the process graphic builder 612 uses the relationships and process flows between the equipment to automatically connect the shapes within the display, as described in greater detail below. Each equipment-level shape 802-804 can also embed data binding references and parameters and values associated with run-time behavior. This allows dynamic real-time validation of run-time behavior while a process graphic is being built.

The process graphic builder 612 uses the visualization library 610 to generate an HMI visual representation of process graphics 614. The HMI visual representation can include a visual representation of the display model 608 and a canvas in which to generate process graphics. The HMI visual representation can be provided to a graphic rendering component 616, which renders the process graphics 614 for presentation to a user.

Figure 9:
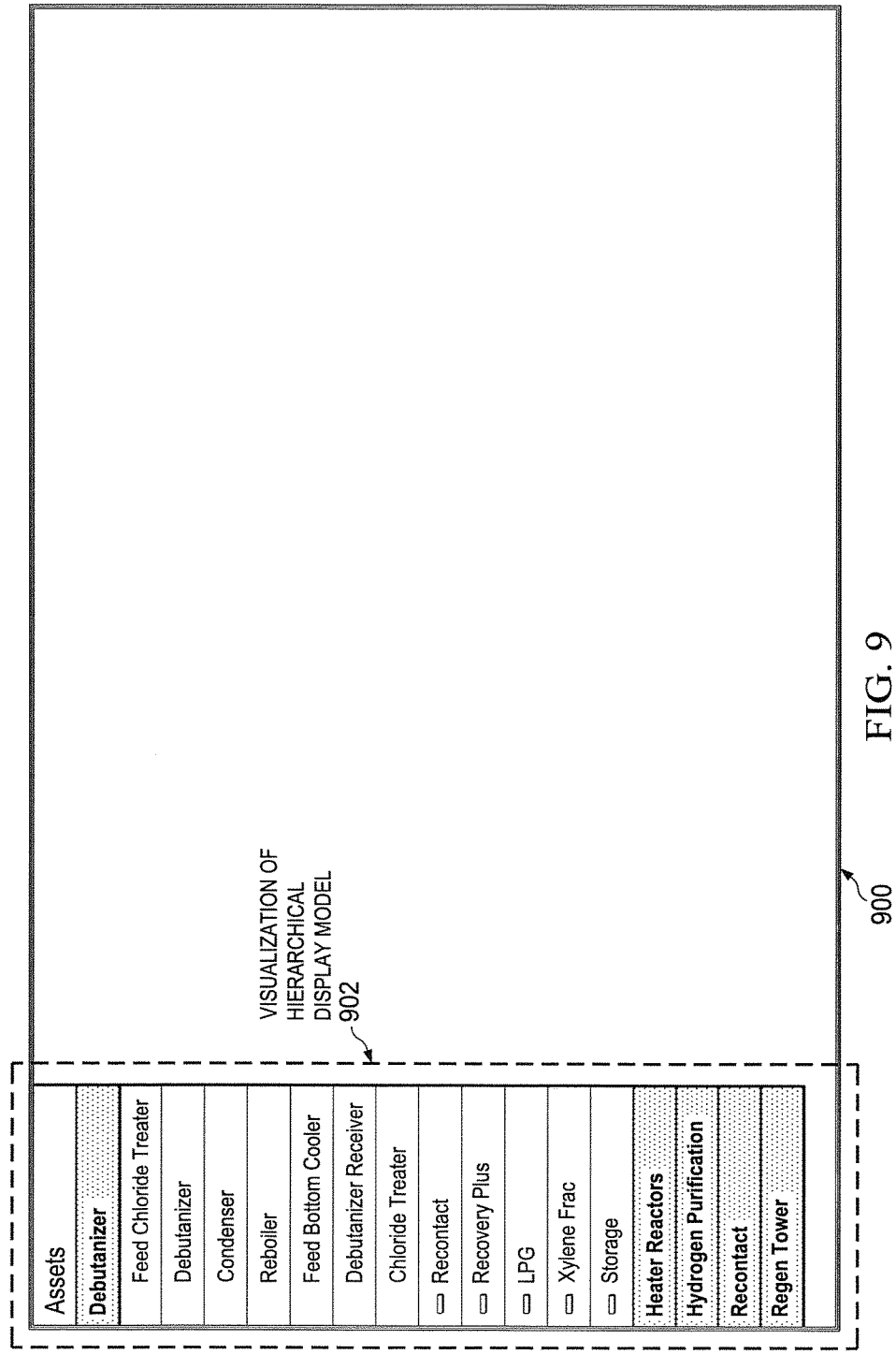
Figure 10:
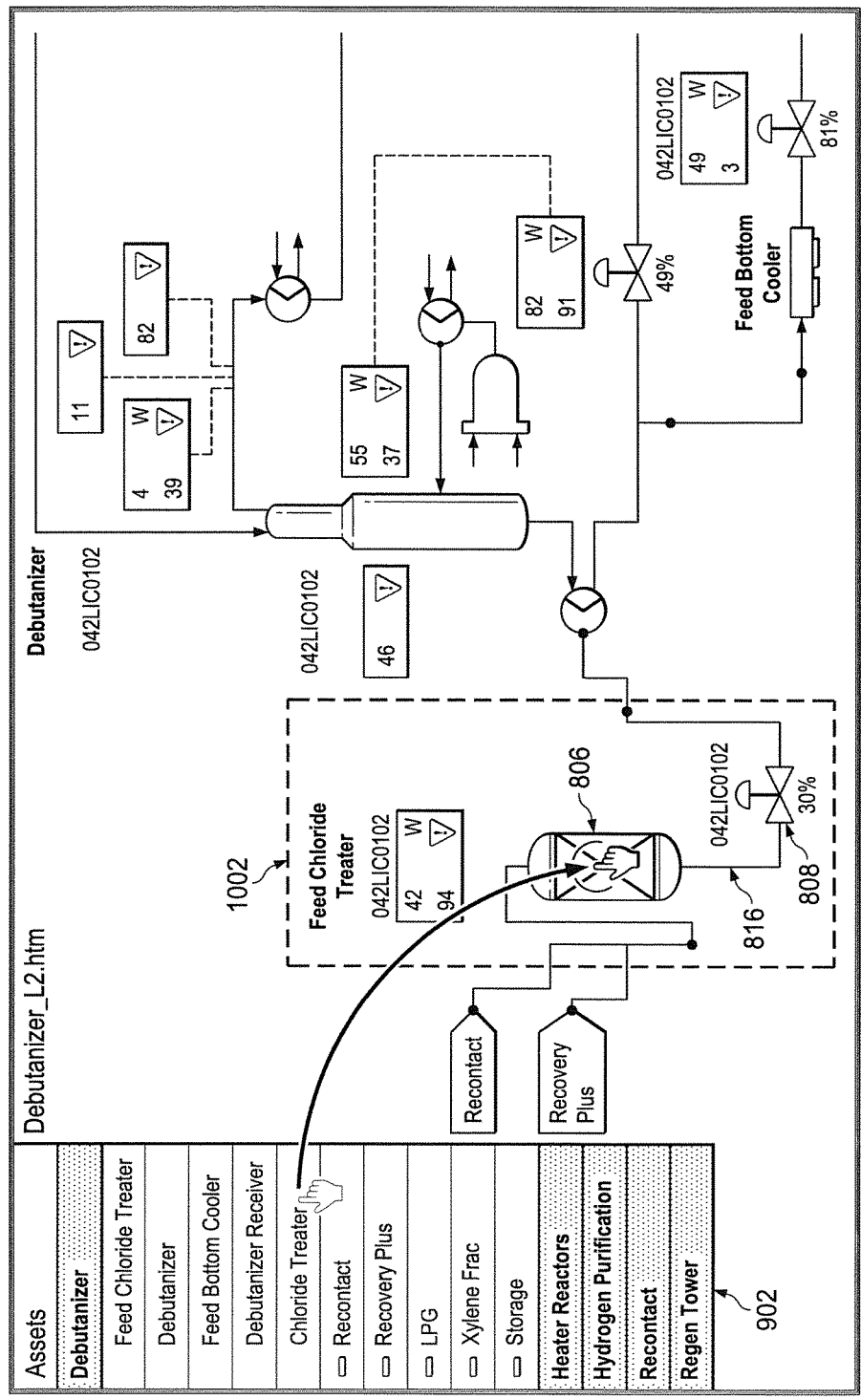
Figure 12:
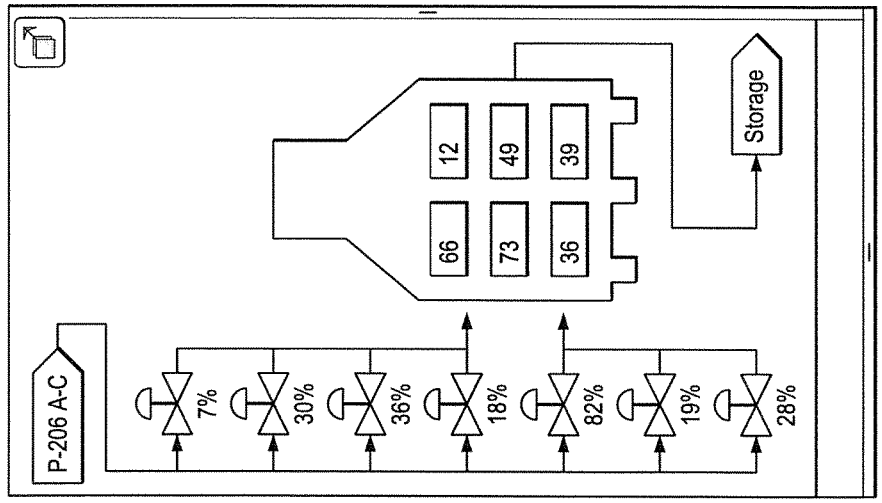
Figure 11:
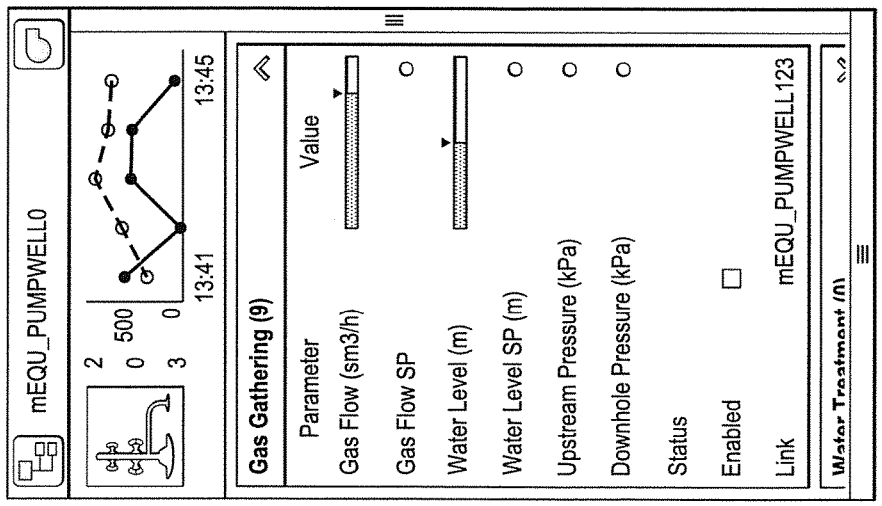

The process graphic builder 612 could receive a user's selection of equipment to be included in the process graphics. For example, FIG. 9 illustrates one example interface 900 that provides a visualization of the types of equipment 902 that could be selected by a user, and FIG. 10 illustrates the user selecting and dragging an instance 1002 of the equipment 902 into a display area 1000. When the user selects one of the types of equipment 902, the process graphic builder 612 identifies one or more shapes associated with the selected equipment 902 and displays visual representations of the shape(s) on the display area 1000. The visual representations of the selected equipment 902 inserted into the display area 1000 can come from the visualization library 610. The selected equipment 902 shown in FIG. 10 can represent the equipment-level shape 802 shown in FIG. 8 and can include multiple instrument-level shapes 806-808 and connectors 816. Similarly, the selected equipment instance 1002 (represented by the dashed line in FIG. 10) includes all of the instrument-level shapes 806-808 and connectors 816 that are part of the selected equipment 902. Of course, this is merely one example; the selected equipment 902 and instance 1002 could represent any other suitable equipment.

The equipment instance 1002 is a single visual representation object block that includes multiple components 806-808, 816. As the equipment instance 1002 is dragged and positioned in the display area 1000, the associated components 806-808, 816 move together. Relationships between multiple pieces of selected equipment 902 can be used to automatically render connections between the added equipment instance 1002 and other related equipment in the display area 1000. Once the user is finished, the process graphic builder 612 can generate an HMI visual representation of the equipment in the display area 1000.

Display creation is therefore a simple process of selecting equipment 902 and moving (e.g., dragging) the equipment instance 1002 to the display area 1000. It is no longer necessary to build displays at the instrument shape level, add individual instrument shapes and manual drawing lines and connections between the shapes to represent their relationships and the process flows. In addition, no display level scripting knowledge is required for the engineer or display builder. Scripting logic is built into the model and incorporated into the display as each component is added to the display. Additionally, the data binding references and parameters for each equipment 1002 automatically and dynamically respond to each other during the build process, which allows dynamic real-time validation of run-time behavior while the process graphic is being built.

The graphic rendering component 616 renders process graphics and visual equipment shapes in a chosen rendering technology (such as HTML5). On devices with a from factor smaller than the size of a process graphic, the graphic rendering component 616 can apply an adaptive layout algorithm to render the process graphic within the form factor of the selected device (such as a mobile phone or tablet). A process graphic may be modified and displayed in a number of different ways on a smaller form factor. One way involves a responsive design where content is moved to suit a smaller device as in FIG. 11. Another way involves using the hierarchical display model 608 to only show one equipment shape at a time and providing a navigation model that allows a user to move between related equipment shapes in the display and navigating to other displays as in FIG. 12.

Over time, changes can occur in the industrial process associated with a process graphic, in the rendering technology associated with a process graphic, or in both. The technique 600 described herein facilitates any updates to a process graphic. For example, if process requirements of the industrial process change, the new requirements can be implemented in an updated process model 602. Since other components used in the technique 600 may remain the same (including the visualization libraries 610), it can be very easy to generate an updated process graphic based on the new requirements by selecting the updated process model 602 and initiating an automated update process based on the technique 600. This may be as simply as a user clicking on an "update" button or selecting an "update" menu option. Similarly, if the rendering technology changes (e.g., a newer version of HTML), but process requirements of the industrial process remain the same, then the visualization library 610 can be updated while the process model 602 remains the same. The updated process graphic based on the new rendering technology can be generated by selecting the updated visualization library 610 and initiating an automated update process based on the technique 600.

Each of the components 604, 606, 612, 616 could be implemented using any suitable hardware or combination of hardware and software or firmware instructions. In particular embodiments, each of the components 604, 606, 612, 616 is implemented using software executed by the processing device 204 of the computing device 200.

Although FIGS. 6 through 12 illustrate one example of a technique for generating industrial process graphics and related details, various changes may be made to FIGS. 6 through 12. For example, various components in FIG. 6 could be combined, further subdivided, or omitted and additional components could be added according to particular needs. Also, the graphics shown in FIGS. 7 through 12 are examples only.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as welt as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. A method comprising:
parsing, by at least one processing device, information associated with an industrial process to identify equipment data associated with the industrial process, the equipment data comprising at least one equipment relationship between two or more pieces of equipment;
receiving, by the at least one processing device from a user, a selection of first equipment and a placement of the first equipment in a first graphical interface of a first display having a first form factor;
identifying, by the at least one processing device, one or more first shapes associated with the first equipment;
automatically generating, by the at least one processing device, a first process graphic in the first graphical interface, the first process graphic containing the one or more first shapes;
receiving, by the at least one processing device from the user, a selection of second equipment and a placement of the second equipment in the first graphical interface;
identifying, by the at least one processing device, one or more second shapes associated with the second equipment;
determining, by the at least one processing device, at least one connector between the first and second equipment based on the placement of the second equipment and the at least one equipment relationship;
updating, by the at least one processing device, the first process graphic to contain the one or more second shapes and the at least one connector;
generating, by the at least one processing device, a second process graphic based on the first process graphic, the second process graphic generated at a higher level of abstraction than the first process graphic; and
generating, by the at least one processing device, a third process graphic based on the first process graphic, the third process graphic generated at a higher level of abstraction than the second process graphic,
wherein at least one of the second process graphic and the third process graphic is configured for presentation on a second graphical interface of a second display having a second form factor, the second form factor being smaller than the first form factor of the first display.

2. The method of claim 1, wherein the information comprises at least one of an equipment model, a blending and movement model, a piping and instrumentation diagram (P&ID), or a pre-existing process graphic associated with the industrial process.

3. The method of claim 2, wherein the equipment data further comprises at least one of an item name, an equipment class, or an asset identifier.

4. The method of claim 1, wherein:
each of the first and second equipment comprises multiple instruments, and
the one or more first shapes or the one or more second shapes associated with the first or second equipment comprise an instrument-level shape for each of the multiple instruments and at least one additional connector connecting two or more of the multiple instrument-level shapes.

5. The method of claim 4, wherein the multiple instrument-level shapes and the at least one additional connector are configured to move and be positioned as a group in the first graphical interface.

6. The method of claim 1, wherein the one or more first shapes and the one or more second shapes are identified from a visualization library that is associated with a first graphical rendering technology, the visualization library comprising a plurality of equipment-level shapes and instrument-level shapes for use in process graphics.

7. The method of claim 6, further comprising:
after the visualization library is updated from the first graphical rendering technology to a second graphical rendering technology:
identifying one or more third shapes associated with the first and second equipment n the second graphical rendering technology; and
automatically re-generating the first process graphic containing the one or more third shapes in the second graphical rendering technology.

8. An apparatus comprising:
at least one memory configured to store information associated with an industrial process; and at least one processing device configured to:
parse the information to identify equipment data associated with the industrial process, the equipment data comprising at least one equipment relationship between two or more pieces of equipment;
receive from a user a selection of first equipment and a placement of the first equipment in a first graphical interface of a first display having a first form factor;
identify one or more first shapes associated with the first equipment;
automatically generate a first process graphic in the first graphical interface, the first process graphic containing the one or more first shapes;
receive from the user a selection of second equipment and a placement of the second equipment in the first graphical interface;
identify one or more second shapes associated with the second equipment;
determine at least one connector between the first and second equipment based on the placement of the second equipment and the at least one equipment relationship;
update the first process graphic to contain the one or more second shapes and the at least one connector;

generate a second process graphic based on the first process graphic, the second process graphic generated at a higher level of abstraction than the first process graphic; and
generate a third process graphic based on the first process graphic, the third process graphic generated at a higher level of abstraction than the second process graphic,
wherein at least one of the second process graphic and the third process graphic is configured for presentation on a second graphical interface of a second display having a second form factor, the second form factor being smaller than the first form factor of the first display.

9. The apparatus of claim 8, wherein the information comprises at least one of an equipment model, a blending and movement model, a piping and instrumentation diagram (P&ID), or a pre-existing process graphic associated with the industrial process.

10. The apparatus of claim 9, wherein the equipment data further comprises at least one of an item name, an equipment class, or an asset identifier.

11. The apparatus of claim 8, wherein:
each of the first and second equipment comprises multiple instruments, and
the one or more first shapes or the one or more second shapes associated with the first or second equipment comprise an instrument-level shape for each of the multiple instruments and at least one additional connector connecting two or more of the multiple instrument-level shapes.

12. The apparatus of claim 11, wherein the multiple instrument-level shapes and the at least one additional connector are configured to move and be positioned as a group in the first graphical interface.

13. The apparatus of claim 8, wherein the at least one processing device is configured to identify the one or more first shapes and the one or more second shapes from a visualization library that is associated with a first graphical rendering technology, the visualization library comprising a plurality of equipment-level shapes and instrument-level shapes for use in process graphics.

14. The apparatus of claim 13, wherein the at least one processing device is further configured to:
after the visualization library is updated from the first graphical rendering technology to a second graphical rendering technology:
identify one or more third shapes associated with the first and second equipment in the second graphical rendering technology; and
automatically re-generate the first process graphic containing the one or more third shapes in the second graphical rendering technology.

15. A non-transitory computer readable medium containing instructions that, when executed by at least one processing device, cause the at least one processing device to:
parse information associated with an industrial process to identify equipment data associated with the industrial process, the equipment data comprising at least one equipment relationship between two or more pieces of equipment;
receive from a user a selection of first equipment and a placement of the first equipment in a first graphical interface of a first display having a first form factor;
identify one or more first shapes associated with the first equipment;

automatically generate a first process graphic in the first graphical interface, the first process graphic containing the one or more first shapes;
receive from the user a selection of second equipment and a placement of the second equipment in the first graphical interface;
identify one or more second shapes associated with the second equipment;
determine at least one connector between the first and second equipment based on the placement of the second equipment and the at least one equipment relationship;
update the first process graphic to contain the one or more second shapes and the at least one connector;
generate a second process graphic based on the first process graphic, the second process graphic generated at a higher level of abstraction than the first process graphic; and
generate a third process graphic based on the first process graphic, the third process graphic generated at a higher level of abstraction than the second process graphic,
wherein at least one of the second process graphic and the third process graphic is configured for presentation on a second graphical interface of a second display having a second form factor, the second form factor being smaller than the first form factor of the first display.

16. The non-transitory computer readable medium of claim 15, wherein the information comprises at least one of an equipment model, a blending and movement model, a piping and instrumentation diagram (P&ID), or a pre-existing process graphic associated with the industrial process.

17. The non-transitory computer readable medium of claim 16, wherein the equipment data further comprises at least one of an item name, an equipment class, or an asset identifier.

18. The non-transitory computer readable medium of claim 15, wherein:
each of the first and second equipment comprises multiple instruments, and
the one or more first shapes or the one or more second shapes associated with the first or second equipment comprise an instrument-level shape for each of the multiple instruments and at least one additional connector connecting two or more of the multiple instrument-level shapes.

19. The non-transitory computer readable medium of claim 18, wherein the multiple instrument-level shapes and the at least one additional connector are configured to move and be positioned as a group in the first graphical interface.

20. The non-transitory computer readable medium of claim 15, wherein the one or more first shapes and the one or more second shapes are identified from a visualization library that is associated with a first graphical rendering technology, the visualization library comprising a plurality of equipment-level shapes and instrument-level shapes for use in process graphics.

* * * * *